(12) United States Patent
Rigney et al.

(10) Patent No.: US 6,544,665 B2
(45) Date of Patent: Apr. 8, 2003

(54) THERMALLY-STABILIZED THERMAL BARRIER COATING

(75) Inventors: Joseph David Rigney, Milford, OH (US); Ramgopal Darolia, West Chester, OH (US)

(73) Assignee: General Electric Company, Schenectady, NY (US)

( * ) Notice: Subject to any disclaimer, the term of this patent is extended or adjusted under 35 U.S.C. 154(b) by 24 days.

(21) Appl. No.: 09/765,228

(22) Filed: Jan. 18, 2001

(65) Prior Publication Data

US 2002/0094448 A1 Jul. 18, 2002

(51) Int. Cl.⁷ .............................. B32B 15/04; F03B 3/12
(52) U.S. Cl. .................... 428/633; 428/304.4; 428/332; 428/338; 428/697; 428/699; 428/702; 428/469; 416/241 B
(58) Field of Search ................................ 428/332, 338, 428/621, 632, 633, 655, 650, 469, 697, 699, 702, 304.4; 416/241 R, 241 B

(56) References Cited

U.S. PATENT DOCUMENTS

| | | | |
|---|---|---|---|
| 4,112,137 A | 9/1978 | Zega | |
| 4,774,150 A | 9/1988 | Amano et al. | |
| 4,996,117 A | 2/1991 | Chu et al. | |
| 5,059,095 A | * 10/1991 | Kushner et al. | |
| 5,296,274 A | 3/1994 | Movchan et al. | |
| 5,418,003 A | 5/1995 | Bruce et al. | |
| 5,474,809 A | 12/1995 | Skelly et al. | |
| 5,512,382 A | 4/1996 | Strangman | |
| 5,562,998 A | 10/1996 | Strangman | |
| 5,683,825 A | * 11/1997 | Bruce et al. | |
| 5,773,078 A | 6/1998 | Skelly | |
| 5,792,521 A | 8/1998 | Wortman | |
| 5,834,070 A | 11/1998 | Movchan et al. | |
| 6,042,951 A | * 3/2000 | Kojima et al. | |

\* cited by examiner

*Primary Examiner*—Deborah Jones
*Assistant Examiner*—Jennifer McNeil
(74) *Attorney, Agent, or Firm*—David L. Narciso; Gary M. Hartman; Domenica N. S. Hartman

(57) ABSTRACT

A thermal barrier coating (TBC) for a component intended for use in a hostile environment, such as the superalloy turbine, combustor and augmentor components of a gas turbine engine. The TBC is formed to contain small amounts of alumina precipitates dispersed throughout the grain boundaries and pores of the TBC to getter oxide impurities that would otherwise allow or promote grain sintering and coarsening and pore coarsening, the consequence of which would be densification of the TBC and therefore increased thermal conductivity. If sufficiently fine, the precipitates also serve to pin the grains and pore boundaries of the TBC, the effect of which is to reduce the tendency for the microstructure of the TBC to sinter, coarsen and undergo pore redistribution, which also increase thermal conductivity of the TBC 26.

17 Claims, 2 Drawing Sheets

THERMALLY-STABILIZED THERMAL BARRIER COATING

FIELD OF THE INVENTION

This invention relates to protective coatings for components exposed to high temperatures, such as the hostile thermal environment of a gas turbine engine. More particularly, this invention is directed to a method of stabilizing the microstructure of a thermal barrier coating (TBC) with alumina precipitates in order to inhibit degradation of the thermal insulating properties of the TBC during high temperature excursions.

BACKGROUND OF THE INVENTION

Higher operating temperatures for gas turbine engines are continuously sought in order to increase their efficiency. However, as operating temperatures increase, the high temperature durability of the components within the hot gas path of the engine must correspondingly increase. Significant advances in high temperature capabilities have been achieved through the formulation of nickel and cobalt-base superalloys. Nonetheless, when used to form components of the turbine, combustor and augmentor sections of a gas turbine engine, such alloys alone are often susceptible to damage by oxidation and hot corrosion attack and may not retain adequate mechanical properties. For this reason, these components are often protected by a thermal barrier coating (TBC) system. TBC systems typically include an environmentally-protective bond coat and a thermal-insulating ceramic topcoat, typically referred to as the TBC. Bond coat materials widely used in TBC systems include oxidation-resistant overlay coatings such as MCrAlX (where M is iron, cobalt and/or nickel, and X is yttrium or another rare earth element), and oxidation-resistant diffusion coatings such as diffusion aluminides that contain aluminum intermetallics.

Ceramic materials and particularly binary yttria-stabilized zirconia (YSZ) are widely used as TBC materials because of their high temperature capability, low thermal conductivity, and relative ease of deposition by plasma spraying, flame spraying and physical vapor deposition (PVD) techniques. TBC's employed in the highest temperature regions of gas turbine engines are often deposited by electron beam physical vapor deposition (EBPVD), which yields a columnar, strain-tolerant grain structure that is able to expand and contract without causing damaging stresses that lead to spallation. Similar columnar microstructures can be produced using other atomic and molecular vapor processes, such as sputtering (e.g., high and low pressure, standard or collimated plume), ion plasma deposition, and all forms of melting and evaporation deposition processes (e.g., cathodic arc, laser melting, etc.). In contrast, plasma spraying techniques. such as air plasma spraying (APS) deposit TBC material in the form of molten "splats," resulting in a TBC characterized by a degree of inhomogeneity and porosity that reduces heat transfer through the TBC.

In order for a TBC to remain effective throughout the planned life cycle of the component it protects, it is important that the TBC maintains a low thermal conductivity throughout the life of the component. However, the thermal conductivities of TBC materials such as YSZ have been observed to increase by 30% or more over time when subjected to the operating environment of a gas turbine engine. This increase has been associated with coarsening of the zirconia-based microstructure through grain and pore growth and grain boundary creep. To compensate for this phenomenon, TBC's for gas turbine engine components are often deposited to a greater thickness than would otherwise be necessary.

Alternatively, internally cooled components such as blades and nozzles must be designed to have higher cooling flow. Both of these solutions are undesirable for reasons relating to cost, component life and engine efficiency.

In view of the above, it can be appreciated that further improvements in TBC technology are desirable, particularly as TBC's are employed to thermally insulate components intended for more demanding engine designs.

BRIEF SUMMARY OF THE INVENTION

The present invention generally provides a thermal barrier coating (TBC) for a component intended for use in a hostile environment, such as the superalloy. turbine, combustor and augmentor components of a gas turbine engine. TBC's of this invention have microstructures that are less susceptible to grain sintering and pore coarsening during high temperature excursions, all of which lead to densification of the TBC. Improvements obtained by this invention can be realized with TBC's deposited to have a columnar grain structure, such as those deposited by EBPVD and other PVD techniques, as well as noncolumnar TBC's that are inhomogeneous and porous as a result of being deposited by plasma spray techniques, such as air plasma spraying (APS).

Typical YSZ source materials available for use in deposition processes often contain more than 0.1 mole percent of impurities, such as oxides of silicon, titanium, iron, nickel, sodium, lithium, copper, manganese and potassium. According to the invention, several of these impurities (particularly silica) in aggregate amounts of as little as 0.02 mole percent can be sufficient to form amorphous phases with low glass transition temperatures or phase/surface modifications that promote surface diffusion. These undesirable phase types decorate nearly all of the grain boundaries and the splat boundaries (for plasma-sprayed TBC) or column boundaries (for PVD TBC) of a TBC. At such levels, these phase types are believed to sufficiently wet the boundaries to allow or promote grain sintering and coarsening and/or surface diffusion kinetics that lead to densification of the TBC, the end result of which is an increase in the thermal conductivity of the TBC. Reducing impurity levels in YSZ source materials to eliminate this densification effect in the TBC can be prohibitively expensive.

As a solution, the invention employs small amounts of alumina precipitates (crystalline structures) dispersed throughout the grain boundaries of the TBC to getter impurities, and particularly the oxide impurities noted above. As used herein, the term "getter" includes various mechanisms by which sintering that would be enhanced by the presence of impurities is neutralized (negated) or at least minimized. Examples of gettering mechanisms include (a) the formation of alumina-containing crystalline compounds such as mullite ($3Al_2O_3.2SiO_2$) alumina titanate ($Al_2O_3.TiO_2$) and/or $Al_2O_3.MnO_2$, and (b) the formation of solid solutions with various compounds, including FeO, $Fe_2O_3$, etc. As a result of being insoluble in zirconia, these alumina-based reaction products form precipitates that can advantageously reduce grain boundary mobility of the YSZ TBC. As such, the alumina precipitates inhibit densification. and the associated increase in thermal conductivity caused by grain sintering and coarsening and/or surface diffusion kinetics that are promoted by the presence of impurities. Another benefit is that, if the alumina precipitates are sufficiently fine, such as on the order of about 2 to 500 nm, the precipitates are able to pin the grain, pore and/or feathery substructure boundaries within the TBC. In doing so, the tendency is reduced for the microstructure of the TBC to sinter, coarsen and undergo pore redistribution (as used herein, when smaller pores coalesce or coarsen to form larger pores) during high temperature exposures, such as temperatures in excess of 1000° C. found within the hot gas path of a gas turbine engine.

According to the invention, incorporating relatively low levels of alumina precipitates serves to reduce or eliminate undesirable impurity effects, while higher levels provide the additional benefit of further stabilizing the YSZ grain structures against coarsening attributable to surface diffusion and grain boundary motion. Accordingly, by providing a small but sufficient amount of fine alumina precipitates within a TBC microstructure, the TBC can be subsequently heated to temperatures in excess of 1200° C. without densification and an associated increase in thermal conductivity. As a result, components can be designed for thinner TBC and/or, where applicable, lower cooling air flow rates, which reduces processing and material costs and promotes component life and engine efficiency.

Other objects and advantages of this invention will be better appreciated from the following detailed description.

DETAILED DESCRIPTION OF THE INVENTION

Figure 1:
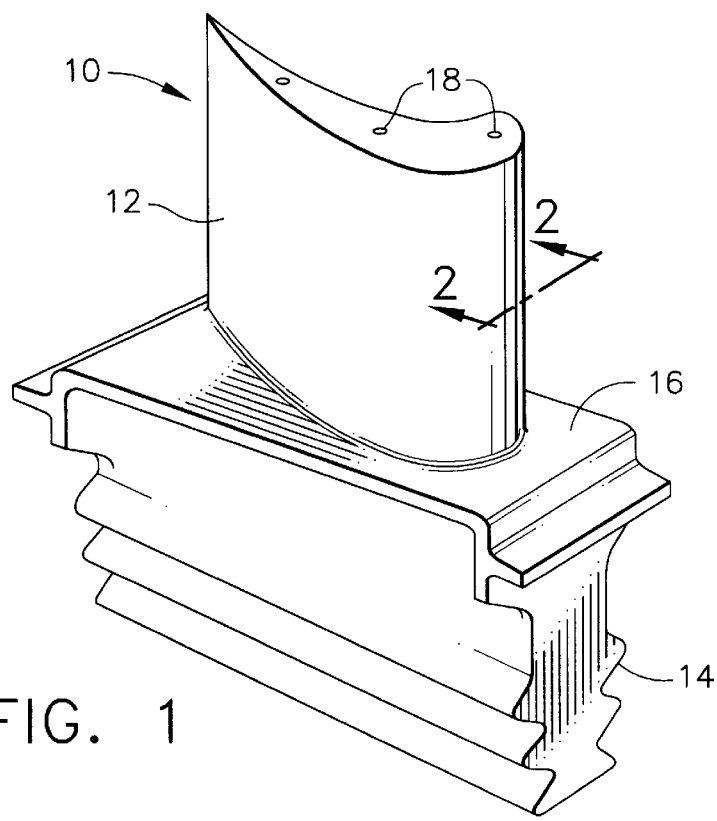
FIG. 1 is a perspective view of a high pressure turbine blade.

The present invention is generally applicable to components subjected to high temperatures, and particularly to components such as the high and low pressure turbine nozzles and blades, shrouds, combustor liners and augmentor hardware of gas turbine engines. An example of a high pressure turbine blade 10 is shown in FIG. 1. The blade 10 generally includes an airfoil 12 against which hot combustion gases are directed during operation of the gas turbine engine, and whose surface is therefore subjected to hot combustion gases as well as attack by oxidation, corrosion and erosion. The airfoil 12 is protected from its hostile operating environment by a thermal barrier coating (TBC) system schematically depicted in FIG. 2. The airfoil 12 is anchored to a turbine disk (not shown) with a dovetail 14 formed on a root section 16 of the blade 10. Cooling passages 18 are present in the airfoil 12 through which bleed air is forced to transfer heat from the blade 10. While the advantages of this invention will be described with reference to the high pressure turbine blade 10 shown in FIG. 1, the teachings of this invention are generally applicable to any component on which a thermal barrier coating may be used to protect the component from a high temperature environment.

Figure 2:
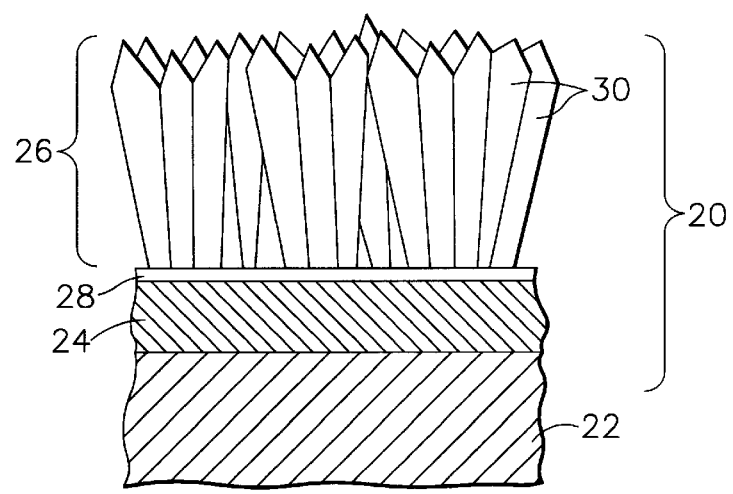
FIG. 2 is a cross-sectional view of the blade of FIG. 1 along line 2—2, and shows a thermal barrier coating system on the blade in accordance with a first embodiment of this invention.

The TBC system 20 is represented in FIG. 2 as including a metallic bond coat 24 that overlies the surface of a substrate 22, the latter of which is typically a superalloy and the base material of the blade 10. As is typical with TBC systems for components of gas turbine engines, the bond coat 24 is an aluminum-rich composition, such as an overlay coating of an MCrAlX alloy or a diffusion coating such as a diffusion aluminide or a diffusion platinum aluminide of a type known in the art. Aluminum-rich bond coats of this type develop an aluminum oxide (alumina) scale 28, which is grown by oxidation of the bond coat 24. The alumina scale 28 chemically bonds a thermal-insulating ceramic layer, or TBC 26, to the bond coat 24 and substrate 22. The TBC 26 of FIG. 2 is represented as having a strain-tolerant microstructure of columnar grains 30, one of which is represented in greater detail in FIG. 4. As known in the art, such columnar microstructures can be achieved by depositing the TBC 26 using a physical vapor deposition technique, such as EBPVD. A preferred material for the TBC 26 is an yttria-stabilized zirconia (YSZ), a preferred composition being about 4 to about 20 weight percent yttria, though other ceramic materials could be used, such as zirconia fully stabilized by yttria, nonstabilized zirconia, or zirconia partially or fully stabilized by magnesia, ceria, scandia or other oxides soluble in zirconia. The TBC 26 is deposited to a thickness that is sufficient to provide the required thermal protection for the underlying substrate 22 and blade 10, generally on the order of about 75 to about 300 micrometers.

Figure 3:
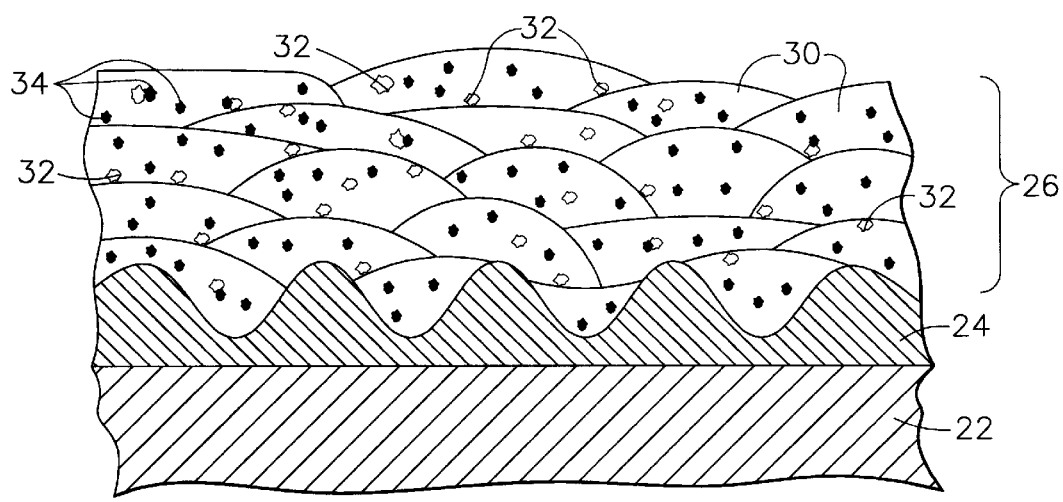
FIG. 3 is a cross-sectional view of a thermal barrier coating system in accordance with a second embodiment of this invention.
Figure 4:
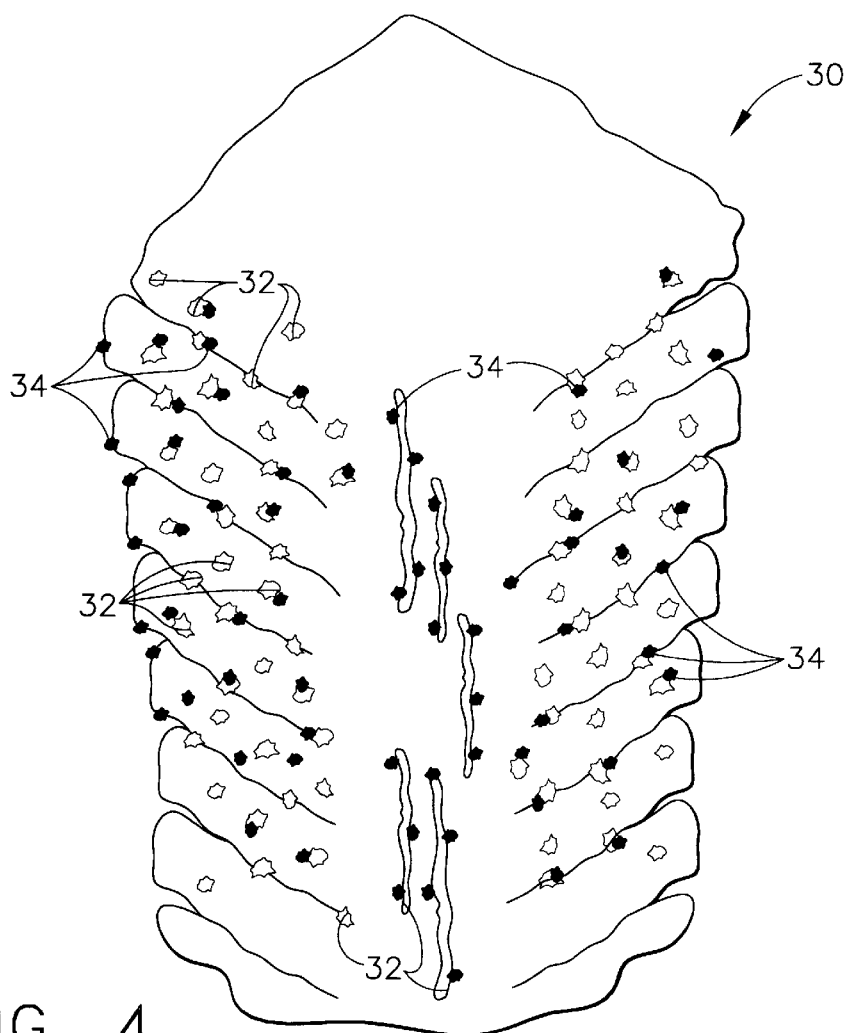
FIG. 4 is a detailed representation of a columnar grain of the thermal barrier coating of FIG. 2.

While much of the following discussion will focus on columnar TBC of the type shown in FIGS. 2 and 4, the invention is also believed to be applicable to noncolumnar TBC deposited by such methods as plasma spraying, including air plasma spraying (APS). The microstructure of this type of TBC is represented in. FIG. 3, in which the same reference numbers used in FIG. 2 to identify the columnar TBC 26 on a substrate 22 and bond coat 24 are now used to identify a similar substrate 22 and bond coat 24 on which a noncolumnar TBC 26 was deposited by plasma spraying. In the plasma spraying process, TBC material is deposited in the form of molten "splats," resulting in the plasma-sprayed TBC 26 of FIG. 3 having a microstructure characterized by irregular flattened grains 30 and a degree of inhomogeneity and porosity.

As is typical in the art, the YSZ source material. used to deposit the TBC's 26 of FIGS. 2 through 4 may contain more than 0.1 mole percent of impurities, such as oxides of titanium, silicon, sodium, iron, nickel, lithium, copper, manganese and potassium, and potentially oxides of calcium, magnesium and others. Aggregate amounts of as little as 0.02 mole percent of such impurities can be sufficient to form precipitates that decorate nearly all of the grain boundaries of the TBC microstructure, as well as the splat boundaries (for plasma-sprayed TBC) or column boundaries (for PVD TBC) of the TBC 26. These precipitates are believed to wet the grain boundaries of the TBC 26, allowing or promoting grain boundary sliding and grain sintering and coarsening that lead to densification of the TBC 26 and, consequently, an increase in the thermal conductivity of the TBC 26. To counter this effect, the TBC 26 of this invention is deposited to contain small amounts of alumina which, as a result of being insoluble in YSZ, do not alloy with the surrounding YSZ matrix but instead form discrete precipitates 34 dispersed throughout the grain boundaries of the TBC 26, including adjacent the defects and pores 32 as represented in FIGS. 3 and 4. According to the invention, the precipitates 34 getter the above-noted oxide impurities, and therefore inhibit grain boundary sliding, grain sintering and coarsening. The end result is that the TBC 26 has a stabilized microstructure that resists microstructural changes that would otherwise lead to densification and higher thermal conductivity.

As a result of the processes by which the TBC's 26 of FIGS. 2 through 4 are deposited, the individual. grains 30 of the TBC's 26 are characterized by microstructural defects and pores 32 within the grains 30 and at and between the grain boundaries. According to another aspect of the invention, these defects and pores 32 are believed to decrease the thermal conductivity of the grains 30 of the TBC 26, and therefore the TBC 26 as a whole. However, grain growth, sintering and pore redistribution (coalescing) within the TBC 26 during high temperature excursions tend to eliminate the defects and pores 32. The present invention is able to inhibit these microstructural changes if the precipitates 34 are sufficiently fine and located within the defects and pores 32, such that the precipitates 34 anchor and pin the grain boundaries and pores 32.

In order to effectively serve as an impurity getter, the precipitates 34 must be present in an amount sufficient for this purpose without adversely affecting other desirable properties of the TBC 26. A suitable molar fraction for the precipitates 34 is believed to be at least 0.1 mole percent up to about 3 mole percent, with a preferred range being about 0.2 to about 1 mole percent. As an impurity getter, the size of the precipitates 34 is not believed to be critical, with diameters of about 2 to about 1000 nm being acceptable. However, to effectively pin the grain boundaries the precipitates 34 must be fine, generally on the order of the size of the pores 32 and process-induced defects within the grains 30 and along the grain boundaries. To perform this role, a preferred particle size range for the alumina precipitates 34 is about 2 to 500 nm. The volume fraction necessary to pin the defects and pores 32 will naturally vary with the amount of defects and pores 32 present in the TBC 26. However, a volume fraction of at least 0.1 percent is believed to be necessary for effective impurity gettering.

Suitable processes for forming the precipitates 34 will depend in part on the manner in which the TBC 26 is deposited. If deposited by plasma spraying, a fine alumina powder can be mixed with a YSZ powder, so that fine alumina precipitates 34 form within the individual "splat" grains 30 as shown in FIG. 3. If deposited by PVD to yield the columnar grain structure shown in FIGS. 2 and 4, a suitable technique is to evaporate multiple ingots, at least one of which is formed of only YSZ while a second is formed of alumina, alone, mixed with YSZ or present as discrete regions within a YSZ ingot. Alternatively, a single ingot containing YSZ and regions of alumina or metallic aluminum can be evaporated to produce the TBC 26. Yet another alternative is to evaporate a YSZ source material in the presence of a chemical vapor deposition (CVD) source of aluminum-containing vapors. When introduced into the coating chamber while YSZ is being evaporated, the aluminum-containing vapors react with the oxygen-containing atmosphere within the chamber to deposit alumina within the TBC. Still another method is to use an ion beam source of aluminum (cathodic arc source) while evaporating a YSZ ingot. to create the precipitates 34. In any case, the deposition process of this invention is carried out so that alumina is evaporated and condenses to form the discrete and fine precipitates 34 represented in FIGS. 3 and 4.

While the invention has been described in terms of a preferred embodiment, it is apparent that other forms could be adopted by one skilled in the art. For example, the TBC 26 could be deposited by other atomic and molecular vapor deposition processes, such as sputtering, ion plasma deposition, and all forms of melting and evaporation deposition processes. Accordingly, the scope of the invention is to be limited only by the following claims.

What is claimed is:

1. A component having a thermal barrier coating on a surface thereof, the thermal barrier coating having a microstructure comprising grains, grain boundaries, and defects and pores at and between the grain boundaries, the thermal barrier coating containing impurities in an amount sufficient to cause at least one of grain boundary sliding, grain sintering and coarsening, and enhanced surface diffusion that lead to densification of the thermal barrier coating, the thermal barrier coating further containing precipitates of alumina within the microstructure in an amount of at least 0.1 mole percent up to 3 mole percent of the thermal barrier coating to getter the impurities so as to inhibit densification of the thermal barrier coating, at least some of the precipitates being located within the defects and pores of the microstructure.

2. A component according to claim 1, wherein the microstructure of the thermal barrier coating is columnar.

3. A component according to claim 1, wherein the microstructure, of the thermal barrier coating is inhomogeneous and porous.

4. A component according to claim 1, wherein the thermal barrier coating is predominantly yttria-stabilized zirconia.

5. A component according to claim 1, wherein the impurities include an oxide of at least one element chosen from the group consisting of silicon, titanium, iron, nickel, sodium, lithium, copper, manganese and potassium.

6. A component according to claim 1, wherein the impurities are present in an aggregate amount of at least 0.02 mole percent of the thermal barrier coating.

7. A component according to claim 1, wherein the impurities are present in an aggregate amount of at least 0.1 mole percent of the thermal barrier coating.

8. A component according to claim 1, wherein the precipitates are present in the thermal barrier coating at a level of up to about 2 mole percent of the thermal barrier coating.

9. A component according to claim 8, wherein the precipitates are present in the thermal barrier coating at a level of up to about 1 mole percent of the thermal barrier coating.

10. A component according to claim 1, wherein the precipitates located within the defects and pores have diameters in a range of about 2 to about 500 nanometers.

11. A gas turbine engine component comprising:
a superalloy substrate;
a metallic bond coat on a surface of the substrate; and
a thermal barrier coating of yttria-stabilized zirconia on the bond coat, the thermal barrier coating having a microstructure with defects and pores at and between grains boundaries of the microstructure, the thermal barrier coating containing oxide impurities of at least one element chosen from the group consisting of silicon, titanium, iron, nickel, sodium, lithium, copper, manganese and potassium, the oxide impurities being present in an aggregate amount of at least 0.02 mole percent of the thermal barrier coating, the thermal barrier coating having alumina precipitates within the microstructure in an amount of at least 0.1 mole percent up to about 2 mole percent of the thermal barrier coating, at least some of the precipitates being located within the defects and pores of the microstructure, the precipitates serving to getter the oxide impurities and/or neutralize their effect so as to inhibit grain sintering and coarsening, and thereby inhibit densification of the thermal barrier coating.

12. A gas turbine engine component according to claim 11, wherein the precipitates are present in the thermal barrier coating at a level of up to about 1 mole percent of the thermal barrier coating.

13. A gas turbine engine component according to claim 11, wherein the oxide impurities are present in an aggregate amount of at least 0.1 mole percent of the thermal barrier coating.

14. A gas turbine engine component according to claim 11, wherein the precipitates located within the defects and pores have diameters in a range of about 2 to about 500 nanometers.

15. A gas turbine engine component according to claim 11, wherein the microstructure of the thermal barrier coating is columnar.

16. A gas turbine engine component according to claim 11, wherein the microstructure of the thermal barrier coating is inhomogeneous and porous.

17. A gas turbine engine component comprising:

a superalloy substrate;

a metallic bond coat on a surface of the substrate; and a thermal barrier coating of yttria-stabilized zirconia on the bond coat, the thermal barrier coating having a microstructure with defects and pores at and between grains boundaries of the microstructure, the thermal barrier coating containing oxide impurities of at least one element chosen from the group consisting of silicon, titanium, iron, nickel, sodium, lithium, copper, manganese and potassium, the oxide impurities being present in an aggregate amount of at least 0.02 mole percent of the thermal barrier coating, the thermal barrier coating having alumina precipitates within the microstructure in an amount of at least 0.1 mole percent up to about 2 mole percent of the thermal barrier coating to getter the oxide impurities and/or neutralize their effect so as to inhibit grain sintering and coarsening, and thereby inhibit densification of the thermal barrier coating, the precipitates having diameters in a range of about 2 to about 500 nanometers.

* * * * *